United States Patent

Ishimaru et al.

[11] Patent Number: 5,877,122
[45] Date of Patent: Mar. 2, 1999

[54] JOSEPHSON ELEMENT HAVING A $NDBA_2CU_3O_{7-Y}$ SUPERCONDUCTOR THIN-FILM WIRING PATTERN

[75] Inventors: Yoshihiro Ishimaru, Yokohama; Yuuji Mizuno, Kashiwa; Katsumi Suzuki, Kodaira; Youichi Enomoto; Shoji Tanaka, both of Tokyo, all of Japan

[73] Assignees: Fujitsu Ltd., Kanagawa; Sharp Kabushiki Kaisha, Osaka; NEC Corp.; International Superconductivity Technology Center, both of Tokyo, all of Japan

[21] Appl. No.: 649,205

[22] Filed: May 17, 1996

[30] Foreign Application Priority Data

May 19, 1995 [JP] Japan ................................. 7-145601

[51] Int. Cl.$^6$ ................................................... H01L 39/22
[52] U.S. Cl. .......................... 505/190; 505/329; 505/702; 257/33; 257/34
[58] Field of Search ..................................... 505/190, 329, 505/702; 257/33, 34; 427/62

[56] References Cited

U.S. PATENT DOCUMENTS 5,077,266  12/1991  Takagi et al. ............................ 505/329
5,525,584   6/1996  Murakami et al. .

FOREIGN PATENT DOCUMENTS

A63-262878  10/1988  Japan .
A64-89571    4/1989  Japan .
A4-132278    5/1992  Japan .
A4-152686    5/1992  Japan .
A4-155875    5/1992  Japan .
A6-151986    5/1994  Japan .

OTHER PUBLICATIONS

Ishimaru et al, Int. Workshop Supercond., 426–427 International Superconductivity Technology Center, Toyko, Japan 1995.

Badaye et al, Appl. Phys. lett 66(16) Apr. 1995, pp. 2131–2133.

"Melt Processing for Obtaining $NdBa_2Cu_3O_y$ Superconductors with High $T_c$ and Large $J_c$", S.I. Yoo et al.; Tokyo, Japan, Published May 17, 1994; Appl. Phys. Lett. 65(5), Aug. 1, 1994, pp. 633–635.

*Primary Examiner*—Roy V. King
*Attorney, Agent, or Firm*—Armstrong, Westerman, Hattori, McLeland & Naughton

[57] ABSTRACT

An oxide superconductor element, produced by forming a damaged region on a substrate surface by the Ga$^+$ focusing ion beam method and then depositing an oxide superconductor thin-film over it, is characterized in that a $NdBa_2Cu_3O_{7-y}$ ($0 \leq y \leq 0.5$) oxide superconductor is used in a tunnel junction having a tunneling barrier region with weak superconductivity.

2 Claims, 7 Drawing Sheets

×1000

×750

JOSEPHSON ELEMENT HAVING A NDBA$_2$CU$_3$O$_{7-Y}$ SUPERCONDUCTOR THIN-FILM WIRING PATTERN

BACKGROUND OF THE INVENTION

1. Field of the Invention

The present invention relates to a Josephson element employing an oxide superconductor operating at below the temperature of liquid nitrogen, and to a process for its production.

2. Description of the Related Art

The creation of Josephson junctions, which are the basis of superconducting electronic devices, involves the use of multiple thin-films, and the superconducting coherence length at their interface is an important parameter. Since all oxide superconductors have low carrier concentrations compared to normal metals, the superconductive characteristics are subtly influenced by the crystalline structure and composition. Therefore, damaged layers are produced by defects at junction interfaces. In such cases, a short coherence length makes it impossible to achieve satisfactory junction characteristics. All superconductors with a high Tc (critical temperature), however, have short coherence lengths. In addition, the quantum phenomenon of the tunneling effect is highly dependent on the geometry of the junction interface. This has meant low reproducibility of the characteristics of Josephson junctions of oxide superconductors. On the other hand, a major advantage of Josephson junctions is low power consumption, and this has been very advantageous for the integration of multiple elements. The homogeneity (reproducibility) of element characteristics thus becomes essential for realizing design performance. In addition, the fact that Josephson junctions have no amplification function necessitates a narrow distribution of element characteristics for realizing circuit performance. This has led to continuous active research for improving the reproducibility of Josephson junctions. One thing that has been learned is that Josephson junctions may be achieved relatively easily by forming plane-configured junctions which allow the a-axis direction, having a relatively long coherence length, to be oriented perpendicular to the junction surface (Japanese Unexamined Patent Publication (Kokai) No. 6-151986).

According to a known process, after preliminary treatment of the (100) surface of a single crystal substrate, such as MgO, SrTiO$_3$, etc., which may include formation of a groove, amorphization and roughening, a YBCO or BSCCO film is formed, and the treated region is made into a tunneling barrier region. Japanese Unexamined Patent Publication (Kokai) No. 4-152686 discloses formation of a groove 0.2 μm wide and 0.1 μm deep in a MgO (100) single crystal substrate by photo etching (Ar sputtering), followed by formation of a BSCCO film by RF magnetron sputtering to create a tunneling Josephson junction. Japanese Unexamined Patent Publication (Kokai) No. 4-155875 discloses excimer laser irradiation of a MgO or SrTiO$_3$ (100) single crystal substrate for melting and resolidification to amorphize a 1 μm width, followed by formation of a YBCO or BSCCO film by sputtering. Finally, Japanese Unexamined Patent Publication (Kokai) No. 4-132278 discloses rough finishing of the entire surface of a MgO or SrTiO$_3$ (100) single crystal substrate with diamond powder, coating an approximately 1 μm width with a resist, and melting of the other sections by Ar ion milling to flatten them, followed by formation of a YBCO film.

With the methods disclosed in the above-mentioned publications, however, it is still difficult to control the critical current value, and it has not been possible to provide sufficient reproducibility for integration. In the case of planar junctions, the barrier layer is roughly the same substance as the thin-film, and the critical current value is highly dependent on the cross-sectional area of the junction. Consequently, it is believed that any irregularities in the quality of the thin-film will lead to variations in the characteristics of the barrier layer or the lateral characteristics during patterning, thus eventually resulting in poor reproducibility. Particularly when a YBCO thin-film is deposited by the pulse laser method, particulates are generated and reside in the junction surface, thus lowering the critical current value.

The present invention relates to a Josephson element which employs a superconductor, and specifically it provides a Josephson element employing a NdBa$_2$Cu$_3$O$_{7-y}$ thin-film for the purpose of preventing the generation of particulates by the use of the NdBa$_2$Cu$_3$O$_{7-y}$ thin-film which has excellent surface flatness and homogeneity, in order to improve the reproducibility of critical current densities of plane-configured Josephson junctions, thus opening the door to integration of Josephson junctions.

SUMMARY OF THE INVENTION

In order to overcome the problems described above, the present invention provides a Josephson element having a construction in which an oxide superconductor thin-film wiring pattern is formed on the same plane as a substrate, the plane of the substrate has a band-like single crystal damaged region traversing the wiring pattern, the wiring pattern has the same composition, the damaged region has a region in which the wiring pattern is 300 nm wide or less and the superconductivity thereof is lower than that of the other region of the wiring pattern (weak), and the crystal orientation of the wiring pattern on both sides of the low (weak) superconductivity region is identical, wherein the oxide superconductor is NdBa$_2$Cu$_3$O$_{7-y}$ ($0 \leq y \leq 0.5$).

The present invention likewise provides a process for producing a Josephson element which comprises the steps of forming a band-like damaged region on the substrate surface by the focused ion beam method, depositing an oxide superconductor thin-film on the substrate so as to traverse the damaged region while forming a tunneling barrier region on the damaged region where the superconductivity is lowered, wherein NdBa$_2$Cu$_3$O$_{7-y}$ ($0 \leq y \leq 0.5$) is used as the oxide superconductor.

DETAILED DESCRIPTION OF THE INVENTION

The substrate may be any material which allows epitaxial growth of $NdBa_2Cu_3O_{7-y}$, such as MgO, STO ($SrTiO_3$), or the like.

According to the invention, the substrate surface is scanned with a focused ion beam, particularly a $Ga^+$ focused ion beam to form a damaged region on the substrate surface. A $Ga^+$ or other focused ion beam is ideal for forming damaged regions of narrow width (300 nm or less) in single-crystal substrates such as MgO. The beam width should be more narrow the more polycrystallization of the superconductor thin-film deposited on the damaged region (formation of an abnormal phase), and it is actually limited by the focusing ion beam apparatus. Since a damaged region with a width exceeding 300 nm does not provide the desired tunneling effect, the maximum beam width is set to be smaller than this. When the damaged region formed in the substrate surface is observed with an electron microscope there is shown to be formed in the surface a groove-like pit about the width of the beam diameter, but it is unclear whether this shape disturbance is caused by reduction of the crystallinity of the deposited oxide superconductor. It is also possible that the crystallinity of the damaged region itself on the substrate has been reduced.

According to the invention, a $NdBa_2Cu_3O_{7-y}$ oxide superconductor thin-film is deposited on the substrate on the surface of which the band-like damaged region has been formed with the focusing ion beam. The deposition method may be any one which allows growth of superconductive single crystals, such as RF sputtering, pulse laser or MOCVD. The deposited thin-film is grown on the oxide superconductor single crystals having the same crystal orientation over the entire surface, but on the damaged region on the substrate surface, an abnormal phase is generated, causing growth of crystals with low superconductivity. The formation of the abnormal phase has been confirmed with a transmission electron microscope (TEM). This band-like region with the abnormal phase serves as a tunneling barrier. The thickness of the superconductor thin-film need only be sufficient to exhibit superconductivity, because if it is too thick, monocrystallization will proceed from both sides despite the damaged region, while there is little need for thickness; thus it will depend on the width of the damaged region, but may be up to about 350–300 nm, with about 200 nm being most common.

Japanese Unexamined Patent Publication (Kokai) No. 6-151986 uses YBCO ($YBa_2Cu_3O_{7-y}$), etc., but since YBCO and similar compounds are formed with small particulates (insulants) about 1 $\mu$m in size microdispersed in the thin-film (see FIG. 6), when these particulates are generated in the damaged region, i.e. the tunneling barrier forming region, there is a risk of impairing the characteristics of the Josephson element, thus leading to disadvantages such as lower yield and reliability of the product.

Figure 5:
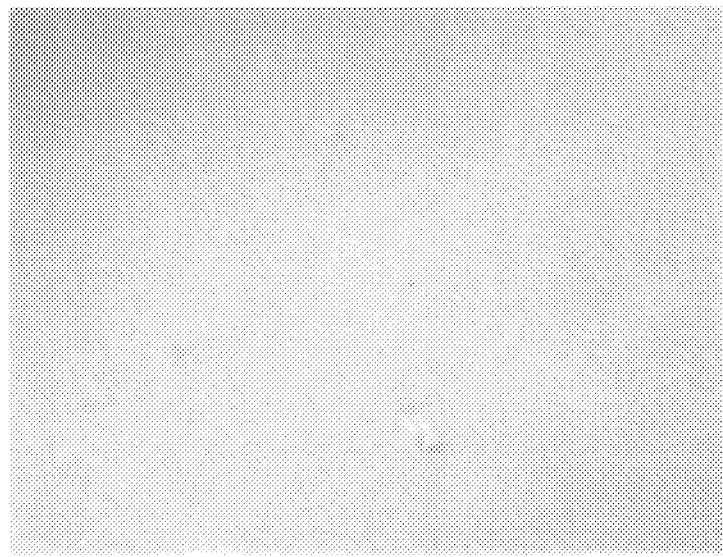
FIG. 5 is a photograph showing an optical microscope image of the metallography of a NdBa$_2$Cu$_3$O$_{7-y}$ thin-film surface.

In contrast, $NdBa_2Cu_3O_{7-y}$ is characterized in that monocrystalline growth is possible without generation of particulates (see FIG. 5). Thus, when $NdBa_2Cu_3O_{7-y}$ is used as the oxide superconductor thin-film according to the invention, perfect single crystals grow with no particulates, thus having the effect of stabilizing the quality of the element product.

After deposition of the $NdBa_2Cu_3O_{7-y}$, patterning is performed to complete the Josephson element. Usually, a narrow-width pattern is formed to transverse the band-like region with the abnormal phase, and patterns are formed on both sides as electrodes.

Since $NdBa_2Cu_3O_{7-y}$ forms perfect single crystals with relatively little influence from changes in the composition and numerous particulates are not generated in the thin-film, this prevents irregularities in sections of the tunneling barrier on the damaged region during growth on the substrate containing the damaged region, and thus increases the quality and reliability of the product.

EXAMPLES

Figure 1:
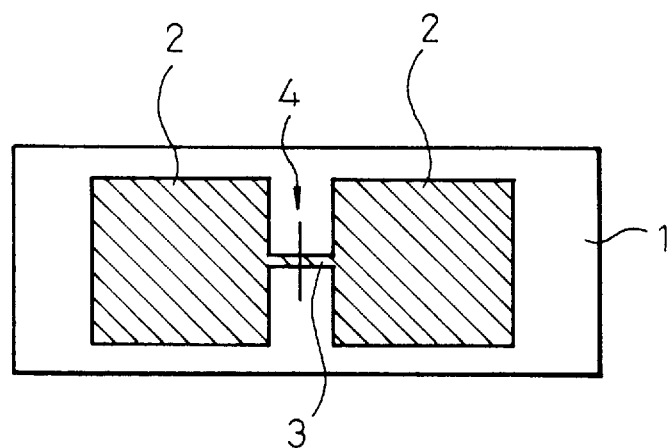
FIG. 1 is a general plane view of the basic construction of a Josephson junction according to the invention.

Preferred embodiments of the present invention will now be explained with reference to the drawings. FIG. 1 is a general plane view of the basic construction according to the invention. In this drawing, 1 is a substrate, 2 and 3 are oxide superconductor thin-films, with 2 indicating electrodes and 3 the narrow pattern zone traversing the damaged region 4 on the surface of the substrate 1, 3' is a region functioning as a tunneling barrier with low superconductivity (weak binding section) and 4 is a band-like damaged region formed on the surface of the substrate 1.

Example 1

Figure 2A:
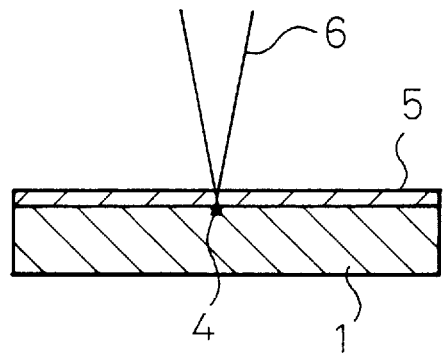
FIGS. 2A, 2B, 2C and 2D represent a summary of the formation process.
Figure 2B:
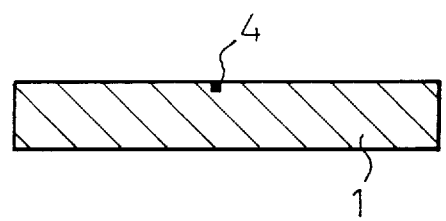
Figure 2C:
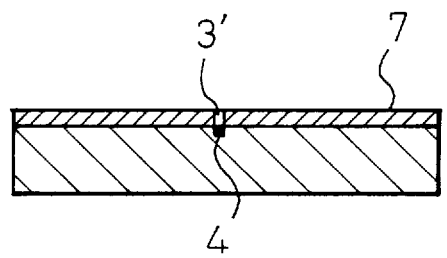
Figure 2D:
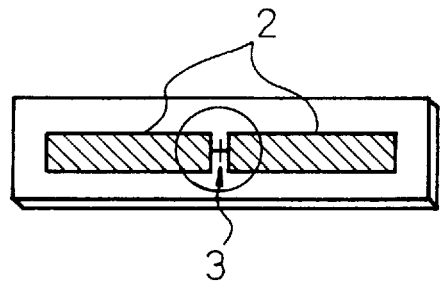

FIGS. 2A–2D represent a summary of the formation process. An approximately 200 nm-thick metal thin-film 5 is deposited on the entire surface of a MgO single-crystal substrate by vacuum vapor deposition. The substrate 1 is then placed in a focusing ion beam apparatus (FIB) and a $Ga^+$ ion beam 6 accelerated to 30 KeV is irradiated on the position 4 forming the tunnel junction. The beam diameter is 50 nm and the beam current is 0.1 pA. For irradiation of the $Ga^+$ ion beam, scanning was performed for 20 seconds at current of 0.1 pA and a length of 10 $\mu$m, and this was repeated twice. Thus is formed a damaged region 4 with a width of 100 nm, a depth of a few nm and a length of 20 $\mu$m (FIG. 2A). The metal thin-film 5 is effective for preventing charging up of the substrate due to the $Ga^+$ ion beam irradiation while also preventing widening due to diffusion of the $Ga^+$ ions, to thus narrowly restrict the width of the irradiated area. The metal thin-film 5 is removed off the entire surface by wet etching with an aqueous solution containing 2.5 wt % KI and 0.65 wt % I(iodine) (FIG. 2B). A $NdBa_2Cu_3O_{7-y}$ thin-film 7 is then formed on the substrate by RF sputtering. For the formation of the thin-film, $NdBa_2Cu_3O_{7-y}$ polycrystals are used as the target, the substrate temperature is 740° C., the discharge pressure is 84 mTorr, the $O_2$ gas flow is 0.5 sccm, the Ar gas flow is 10 sccm, and the growth time is 30 minutes for a 300 nm-thick film. The RF power used is 80 W (FIG. 2C). A narrow-width wiring pattern 3, with a width of 5 $\mu$m and a length of 30 $\mu$m is then formed so as to traverse the electrodes 2 and the damaged region 3 (FIG. 2D).

Figure 3:
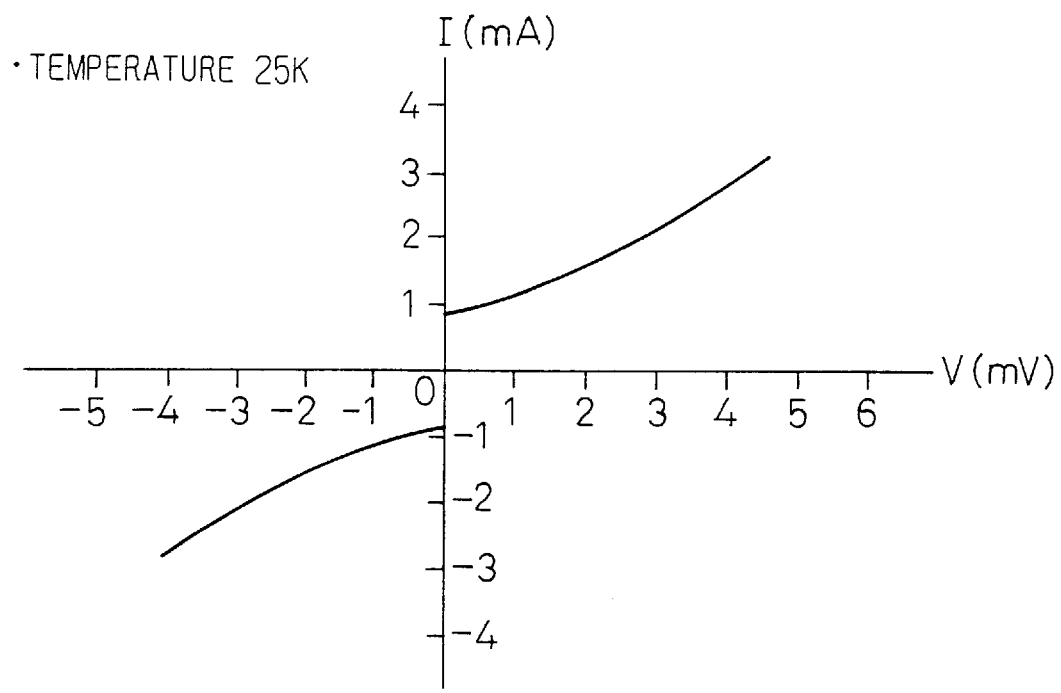
FIG. 3 is a graph showing the current-voltage characteristics of the sample obtained in Example 1.
Figure 4:
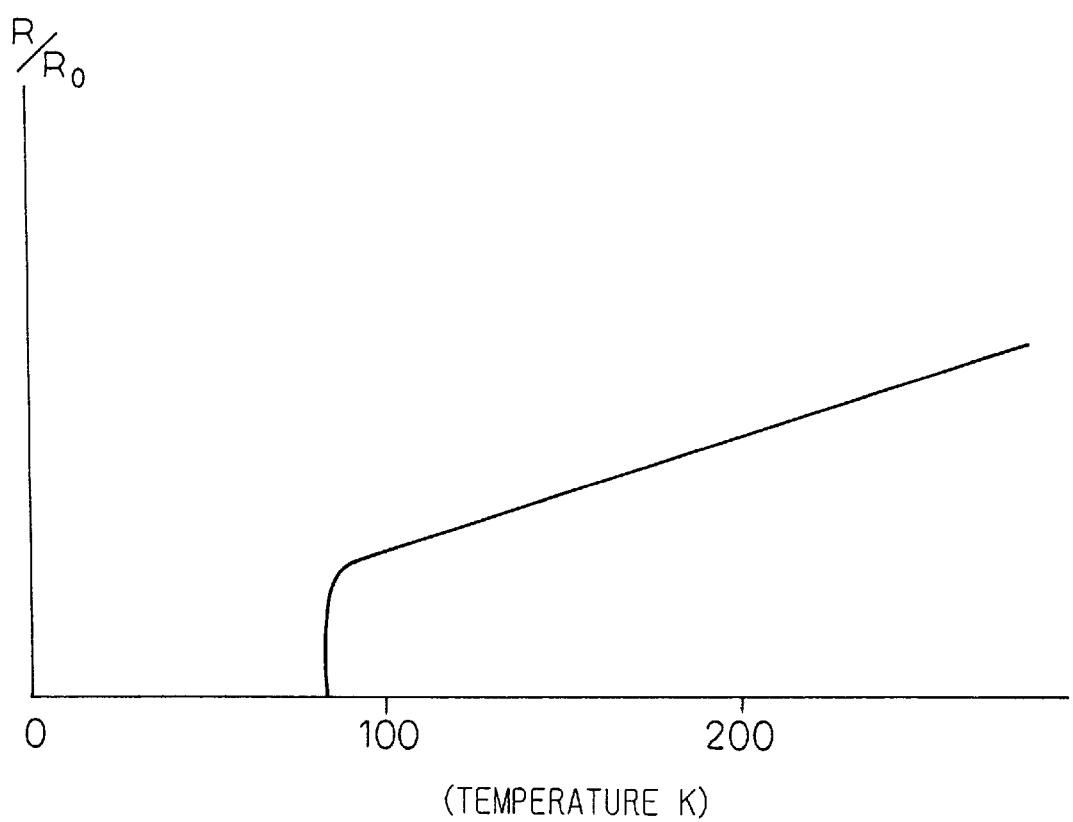
FIG. 4 is a graph showing the temperature dependence of the electrical resistance of the sample obtained in Example 1.

FIG. 3 shows the results of measuring the current-voltage characteristics at a measuring temperature of 25 K, and weak binding characteristics are seen, demonstrating that a Josephson junction had been formed. FIG. 4 shows the temperature dependence of the electrical resistance of the obtained sample. Superconductivity was achieved at 88 K or lower, demonstrating that a good thin-film had been formed.

Figure 6:
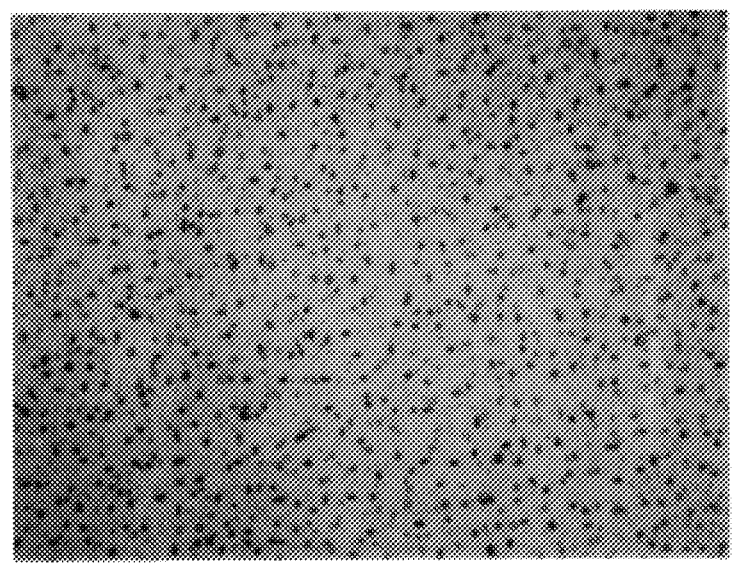
FIG. 6 is a photograph showing an optical microscope image of the metallography of a YBa$_2$Cu$_3$O$_{7-y}$ thin-film surface.

FIG. 5 shows the results of measuring the surface with an optical microscope, and it is clear that the generation of particulates was markedly suppressed compared to the conventional YBCO thin-film (FIG. 6). This is believed to be due to the fact that site substitution between Nd and Ba is easier compared to YBCO, which thus allows compensation for deviations in the composition and reduces particulates generated in the thin-film due to such composition deviations, and also to the fact that during the thin-film formation, the $NdBa_2Cu_3O_{7-y}$ thin-film could be formed in an environment of lower oxygen partial pressure than the $YBa_2Cu_3O_{7-y}$ thin-film, thus allowing minimization of damage due to oxygen ions during the film formation.

Figure 7:
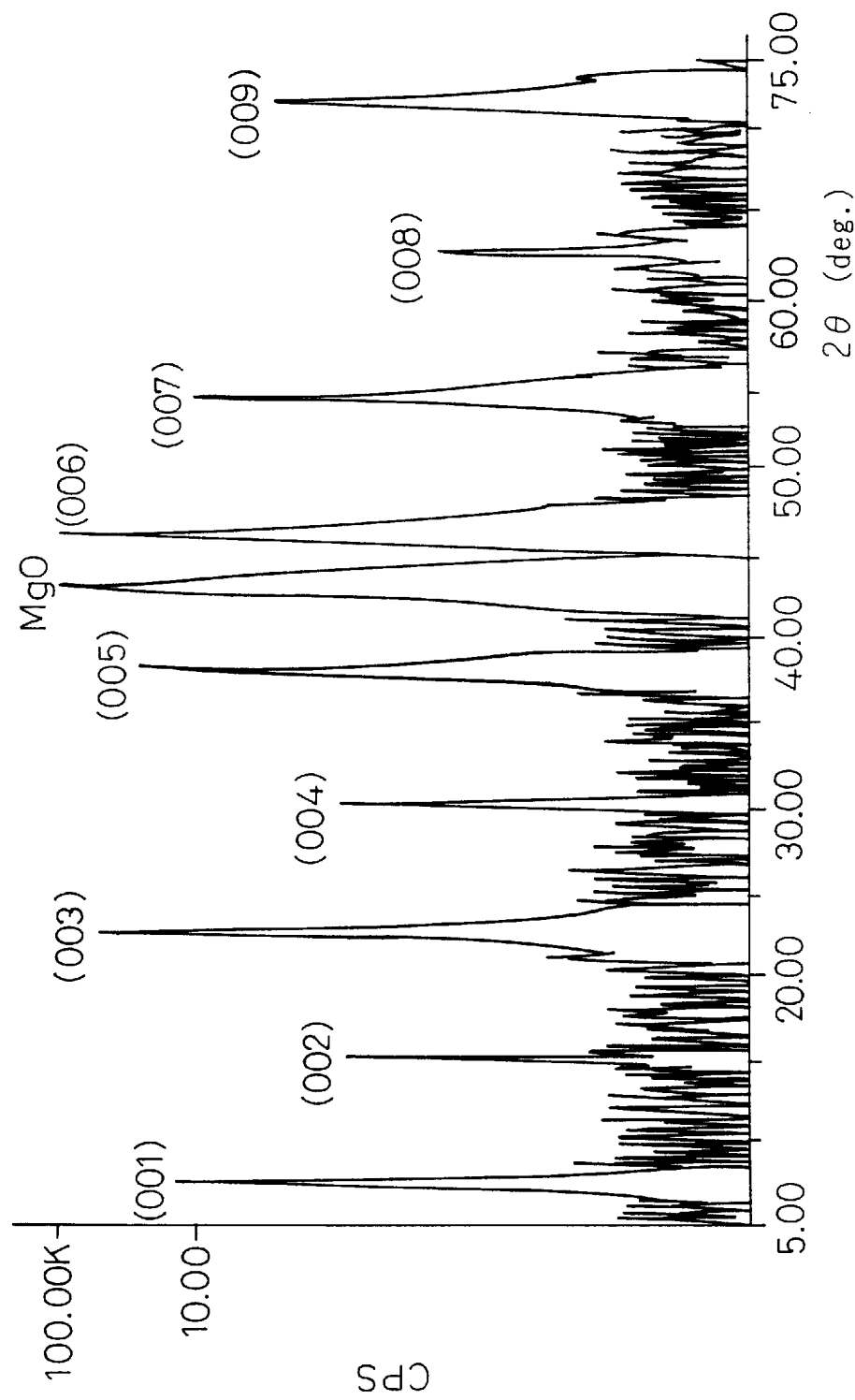
FIG. 7 shows an X-ray diffraction pattern for a NdBa$_2$Cu$_3$O$_{7-y}$ thin-film.
Figure 8:
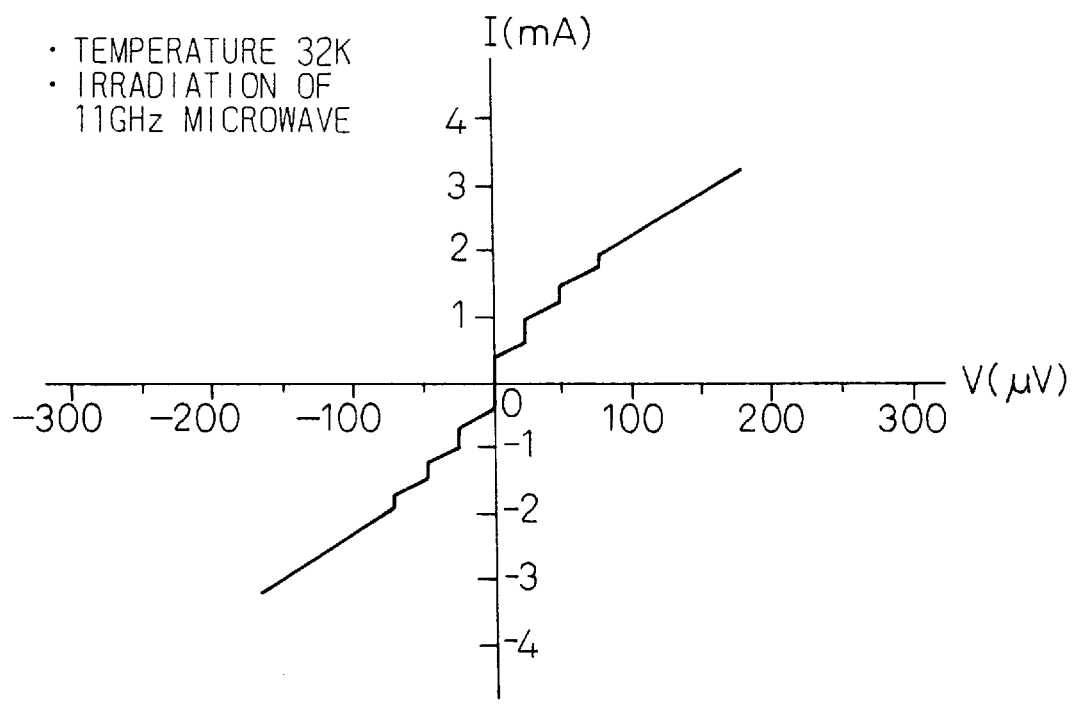
FIG. 8 is a graph showing the current-voltage characteristics for the sample obtained in Example 1 when irradiated with microwaves.

FIG. 7 shows the results of an X-ray diffraction pattern, wherein crystal growth is clearly seen to occur only on the $NdBa_2Cu_3O_{7-y}$ (00i) surface on the MgO (100) substrate, while peaks of other impurities are nonexistent. FIG. 8 shows the current-voltage characteristics upon irradiation with 11 GHz microwaves. The measuring temperature was 32 K. Current step (Shapiro step) characteristics are seen at a voltage corresponding to the frequency of the microwaves, demonstrating that a Josephson junction had been formed.

Example 2

A junction was formed by the same basic process as Example 1, except that the $NdBa_2Cu_3O_{7-y}$ thin-film was deposited by the pulse laser method. An approximately 200 nm-thick metal thin-film is deposited on the entire surface of a MgO single-crystal substrate by vacuum vapor deposition. The substrate is then placed in a focusing ion beam apparatus (FIB) and a $Ga^+$ ion beam accelerated to 30 KeV is irradiated on the position forming the tunnel junction. The beam diameter is 50 nm and the beam current is 0.1 pA. After removing the metal thin-film from the entire surface, the pulse laser method is used to form a $NdBa_2Cu_3O_{7-y}$ thin-film on the substrate. For the formation of the thin-film, $NdBa_2Cu_3O_{7-y}$ polycrystals are used as the target, the substrate temperature is 790° C., the oxygen partial pressure is 100 mTorr, and the growth time is 27 minutes for a 300 nm-thick film. The laser used is a KrF excimer laser, at a wavelength of 248 nm and an energy density of 5 $J/cm^2$. As seen from the X-ray diffraction pattern, as in Example 1, crystal growth occurred on the $NdBa_2Cu_3O_{7-y}$ (00i) surface on the MgO (100) substrate. A narrow-width wiring pattern with a width of 5 μm and a length of 30 μm is then formed so as to traverse the damaged region. From the temperature dependence of the electrical resistance of the obtained sample, the superconductivity was found to be 88 K or less, demonstrating that a good thin-film had been formed. Regarding the current-voltage characteristics upon irradiation with microwaves, as in Example 1, current step (Shapiro step) characteristics are seen at a voltage corresponding to the frequency of the microwaves, demonstrating that a Josephson junction had been formed.

As explained above, the present invention employs a $NdBa_2Cu_3O_{7-y}$ thin-film to realize a plane-configured Josephson junction without particulates on the surface, and thus improve the reproducibility of the critical current at the junction. This makes it possible to form circuits comprising multiple junctions. The excellent surface flatness allows formation of layered junctions, and is thus a fundamental technique for realizing superconductive elements with novel functions.

We claim:

1. A Josephson element having an oxide superconductor thin-film wiring pattern formed on the same plane as a substrate, said plane of said substrate has a band-like single crystal damaged region traversing said wiring pattern, said wiring pattern has the same composition, said damaged region has a width of 300 nm or less and has a region in which said wiring pattern is 300 nm wide or less and a superconductivity thereof is lower than that of the other region of the wiring pattern, and crystal orientation of the wiring pattern on both sides of said low superconductivity region is identical, wherein said oxide superconductor is $NdBa_2Cu_3O_{7-y}$, $0 \leq y \leq 0.5$ with substantially no particulates being present.

2. A Josephson element according to claim 1, wherein said $NdBa_2Cu_3O_{7-y}$ is a c-axis oriented film.

* * * * *